(12) United States Patent
Chen et al.

(10) Patent No.: US 10,157,887 B2
(45) Date of Patent: Dec. 18, 2018

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Tien-Szu Chen, Kaohsiung (TW); Kuang-Hsiung Chen, Kaohsiung (TW); Sheng-Ming Wang, Kaohsiung (TW); I-Cheng Wang, Kaohsiung (TW); Wun-Jheng Syu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/454,520

(22) Filed: Mar. 9, 2017

(65) Prior Publication Data

US 2018/0261573 A1    Sep. 13, 2018

(51) Int. Cl.
*H01L 23/28* (2006.01)
*H01L 23/48* (2006.01)
(Continued)

(52) U.S. Cl.
CPC ...... *H01L 25/0657* (2013.01); *H01L 21/4853* (2013.01); *H01L 21/4857* (2013.01); *H01L 21/565* (2013.01); *H01L 23/24* (2013.01); *H01L 23/29* (2013.01); *H01L 23/3128* (2013.01); *H01L 23/49838* (2013.01); *H01L 25/0655* (2013.01); *H01L 25/50* (2013.01); *H01L 2225/06517* (2013.01);
(Continued)

(58) Field of Classification Search
CPC . H01L 23/50; H01L 25/0655; H01L 21/4853; H01L 2225/06524; H01L 23/24; H01L 2225/06517; H01L 21/565; H01L 25/0657; H01L 2225/06548; H01L 23/3128; H01L 23/49838; H01L 2225/06586; H01L 21/4857; H01L 25/50; H01L 23/528
See application file for complete search history.

(56) References Cited

U.S. PATENT DOCUMENTS 8,378,477 B2    2/2013  Do et al.
8,623,711 B2 *  1/2014  Do ................... H01L 23/49517
                                                         257/693
(Continued)

*Primary Examiner* — Jasmine Clark
(74) *Attorney, Agent, or Firm* — Foley & Lardner LLP; Cliff Z. Liu

(57) ABSTRACT

A semiconductor device package includes a first circuit layer, at least one electrical element, a first molding layer, an electronic component and a second molding layer. The at least one electrical element is disposed over a first surface of the first circuit layer and electrically connected to the first circuit layer. The first molding layer is disposed over the first surface of the first circuit layer. The first molding layer encapsulates an edge of the at least one electrical element, and a lower surface of the first molding layer and a lower surface of the at least one electrical element are substantially coplanar. The electronic component is disposed over a second surface of the first circuit layer and is electrically connected to the first circuit layer. The second molding layer is disposed over the second surface of the first circuit layer and encapsulates the electronic component.

20 Claims, 21 Drawing Sheets

(51) Int. Cl.
*H01L 23/528* (2006.01)
*H01L 21/56* (2006.01)
*H01L 25/065* (2006.01)
*H01L 23/31* (2006.01)
*H01L 23/498* (2006.01)
*H01L 23/29* (2006.01)
*H01L 23/24* (2006.01)
*H01L 25/00* (2006.01)
*H01L 21/48* (2006.01)

(52) U.S. Cl.
CPC ............... *H01L 2225/06524* (2013.01); *H01L 2225/06548* (2013.01); *H01L 2225/06586* (2013.01)

(56) References Cited

U.S. PATENT DOCUMENTS

| | | | |
|---|---|---|---|
| 9,190,296 B2 | 11/2015 | Tsai et al. | |
| 2010/0102438 A1* | 4/2010 | Watanabe | H01L 21/561 257/693 |
| 2012/0074580 A1* | 3/2012 | Nalla | H01L 21/568 257/774 |

* cited by examiner

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including two molding layers having different coefficients of thermal expansion disposed over two opposite surfaces of a circuit layer and a method for manufacturing the same.

2. Description of the Related Art

A three-dimensional (3D) semiconductor device package may be subject to warpage due to its asymmetrical structure and characteristic mismatch between structural layers, such as a mismatch of coefficients of thermal expansion (CTE).

To alleviate warpage, a thickness of the semiconductor package may be increased. However, an increase in thickness of the semiconductor device package presents a conflict with the trend towards minimizing the sizes of electronic products.

SUMMARY

In some embodiments, a semiconductor device package includes a first circuit layer, at least one electrical element, a first molding layer, an electronic component and a second molding layer. The first circuit layer includes a first surface and a second surface opposite to the first surface. The at least one electrical element is disposed over the first surface of the first circuit layer and electrically connected to the first circuit layer. The first molding layer is disposed over the first surface of the first circuit layer. The first molding layer encapsulates an edge of the at least one electrical element, and a lower surface of the first molding layer and a lower surface of the at least one electrical element are substantially coplanar. The electronic component is disposed over the second surface of the first circuit layer and is electrically connected to the first circuit layer. The second molding layer is disposed over the second surface of the first circuit layer and encapsulates the electronic component.

In some embodiments, a semiconductor device package includes a first circuit layer, at least one electrical element, a first molding layer, an electronic component and a second molding layer. The first circuit layer includes a first surface and a second surface opposite to the first surface. The at least one electrical element is disposed over the first surface of the first circuit layer and is electrically connected to the first circuit layer. The first molding layer is disposed over the first surface of the first circuit layer. The first molding layer encapsulates the at least one electrical element. The electronic component is disposed over the second surface of the first circuit layer and is electrically connected to the first circuit layer. The second molding layer is disposed over the second surface of the first circuit layer and encapsulates the electronic component. A coefficient of thermal expansion (CTE) of the first molding layer is different from a CTE of the second molding layer.

In some embodiments, a method of manufacturing a semiconductor device package includes disposing at least one electrical element over a carrier; disposing a first molding layer over the carrier to encapsulate the at least one electrical element; disposing a first circuit layer over the first molding layer and the at least one electrical element; disposing an electronic component over the first circuit layer; and disposing a second molding layer over the first circuit layer to encapsulate the electronic component.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
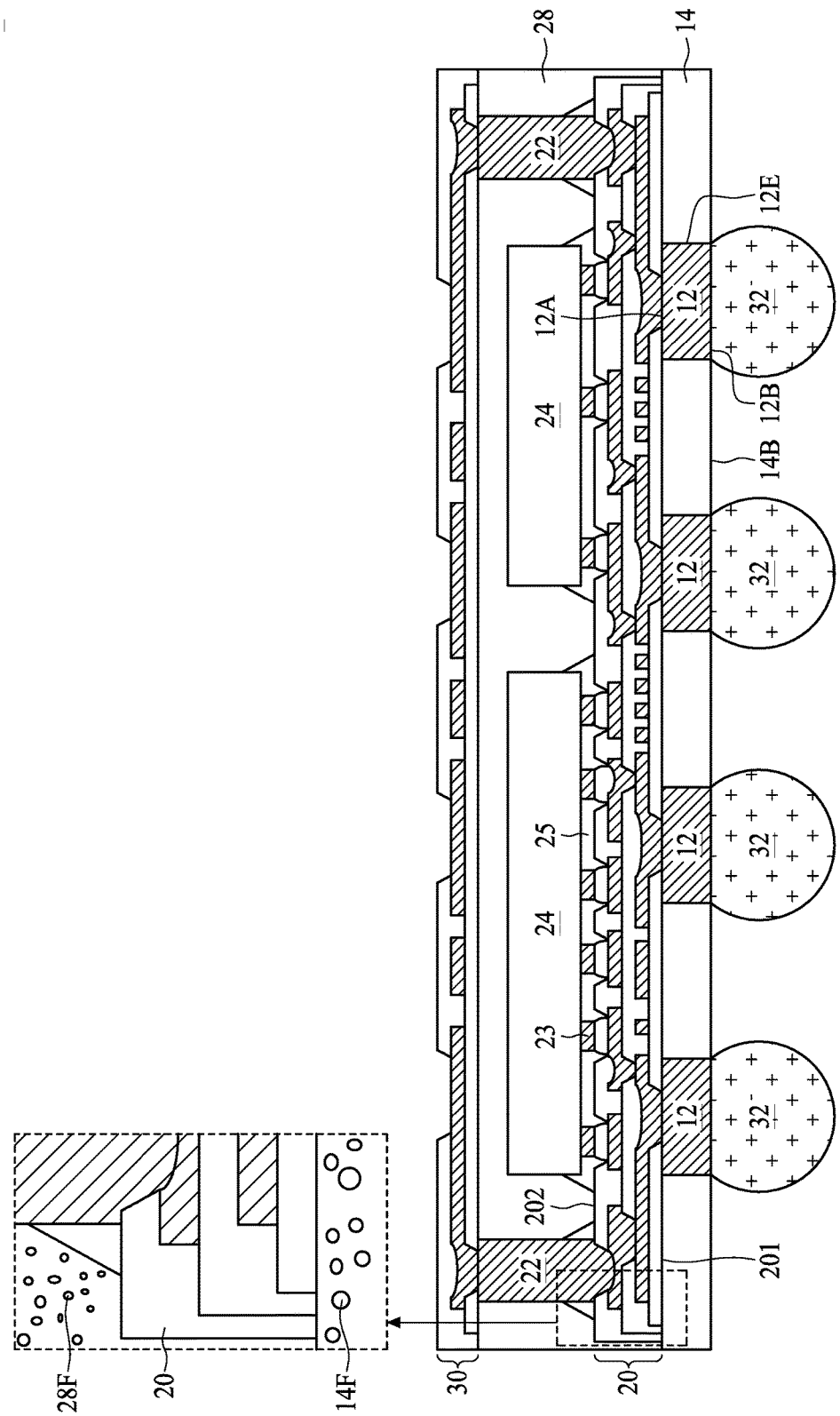
FIG. 1 is a cross-sectional view of a semiconductor device package in accordance with some embodiments of the present disclosure.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

The following description is directed to a semiconductor device package. In some embodiments, the semiconductor device package includes a circuit layer having a first surface and a second surface, an electrical element over the first surface, a first molding layer over the first surface, an electrical component over the second surface, and a second molding layer over the second surface, where a lower surface of the electrical element and a lower surface of the first molding layer are substantially coplanar. In some embodiments, a coefficient of thermal expansion (CTE) of the first molding layer is different from a CTE of the second molding layer. The following description is also directed to a method of manufacturing a semiconductor device package, as discussed below.

FIG. 1 is a cross-sectional view of a semiconductor device package 1 in accordance with some embodiments of the present disclosure. As shown in FIG. 1, the semiconductor device package 1 includes a first circuit layer 20, at least one electrical element 12, a first molding layer 14, one or more electronic components 24 and a second molding layer 28. The first circuit layer 20 includes a first surface 201 and a second surface 202 opposite to the first surface 201. In some embodiments, the first circuit layer 20 includes a redistribution layer (RDL) configured to rearrange input/output (I/O) contacts of the electronic component 24. In some embodiments, the first circuit layer 20 includes one or more conductive wiring layers and one or more dielectric layers stacked on each other. In some embodiments, the conductive wiring layer proximal to the first surface 201 or the second surface 202 is configured as bonding pads such as under bump metallurgies (UBMs).

The at least one electrical element 12 is disposed over the first surface 201 of the first circuit layer 20 and electrically connected to the first circuit layer 20. In some embodiments, the electrical element 12 includes a conductive post, a conductive pillar, a conductive pad or the like. The material of the electrical element 12 includes metal such as copper or the like, alloy such as copper alloy or any other suitable conductive material.

The first molding layer 14 is disposed over the first surface 201 of the first circuit layer 20, and the first molding layer 14 encapsulates the at least one electrical element 12. In some embodiments, the first molding layer 14 encapsulates an edge 12E of the at least one electrical element 12, but exposes a lower surface 12B of the at least one electrical element 12. In some embodiments, a lower surface 14B of the first molding layer 14 and the lower surface 12B of the at least one electrical element 12 are substantially coplanar. In some embodiments, the first molding layer 14 includes fillers 14F, and at least one of the fillers 14F in the first molding layer 14 has a cutting plane adjacent to the lower surface 14B of the first molding layer 14.

The electronic component 24 is disposed over the second surface 202 of the first circuit layer 20 and electrically connected to the first circuit layer 20. In some embodiments, the electronic component 24 includes a semiconductor die including an integrated circuit (IC) formed or disposed therein. In some embodiments, the electronic component 24 includes, but is not limited to, an active component such as an application specific IC (ASIC), a memory component such as a high bandwidth memory (HBM) component or another active component, and/or a passive component such as a capacitor, an inductor, a resistor or the like. In some embodiments, the electronic component 24 is a flip chip component mounted on the second surface 202 of the first circuit layer 20 by surface-mount technology (SMT). By way of example, in some embodiments, the electronic component 24 is bonded on the second surface 202 via conductive bumps 23 such as solder bumps, solder balls, solder pastes or the like.

The second molding layer 28 is disposed over the second surface 202 of the first circuit layer 20 and encapsulates the electronic component 24. In some embodiments, the second molding layer 28 covers an edge and an upper surface of the electronic component 24.

In some embodiments, a CTE of the first molding layer 14 is different from a CTE of the second molding layer 28. The relationship between the CTE of the first molding layer 14 and the CTE of the second molding layer 28 is configured to be matched so as to alleviate warpage. In some embodiments, the CTE of the first molding layer 14 is greater than the CTE of the second molding layer 28. The CTE difference between the first molding layer 14 and the second molding layer 28 can be implemented by selecting different types or materials of the first molding layer 14 and the second molding layer 28, by selecting different materials or sizes of the fillers of the first molding layer 14 and the second molding layer 28, or by other suitable approaches. In some embodiments, the first molding layer 14 and the second molding layer 28 are selected from different molding compounds such as a film molding compound, a liquid molding compound or a granular molding compound so as to have different CTEs. By way of example, in some embodiments, the first molding layer 14 is a film molding compound, and the second molding layer 28 is a liquid molding compound or a granular molding compound. In some embodiments, the first molding layer 14 and the second molding layer 28 include different molding materials. By way of example, in some embodiments, the first molding layer 14 includes an Ajinomoto build-up film (ABF), and a material of the second molding layer 28 includes biphenyl. In some embodiments, the fillers 14F of the first molding layer 14 and fillers 28F of the second molding layer 28 are different in material. By way of example, in some embodiments, the fillers 14F of the first molding layer 14 include aluminum oxide fillers, and the fillers 28F of the second molding layer 28 include silicon oxide fillers. In some embodiments, the fillers 14F of the first molding layer 14 and the fillers 28F of the second molding layer 28 are different in size. By way of example, in some embodiments, the size of the fillers 14F of the first molding layer 14 is larger than a size of the fillers 28F of the second molding layer 28.

In some embodiments, an underfill layer 25 is filled between the electronic component 24 and the first circuit layer 20. In some embodiments, the second molding layer 28 is configured as a molding underfill (MUF) layer, and filled between the electronic component 24 and the first circuit layer 20.

In some embodiments, the semiconductor device package 1 further includes a second circuit layer 30 disposed over the second molding layer 28. In some embodiments, the second circuit layer 30 includes an RDL. In some embodiments, the second circuit layer 30 includes one or more conductive wiring layers and one or more dielectric layers stacked on each other. In some embodiments, the semiconductor device package 1 further includes at least one interconnect 22 disposed between the first circuit layer 20 and the second circuit layer 30. In some embodiments, the interconnect 22 is encapsulated by the second molding layer 28, and electrically connected to the first circuit layer 20 and the second circuit layer 30. In some embodiments, the material of the interconnect 22 includes metal such as copper or the like, alloy such as copper alloy or any other suitable conductive material.

In some embodiments, the semiconductor device package 1 further includes at least one electrical contact 32 disposed over and electrically connected to the electrical element 12.

In some embodiments, the electrical contact 32 includes a conductive bump such as a solder bump, solder ball, a solder paste or the like, configured to be electrically connected to another electronic device such as a circuit board or the like.

Figure 2A:
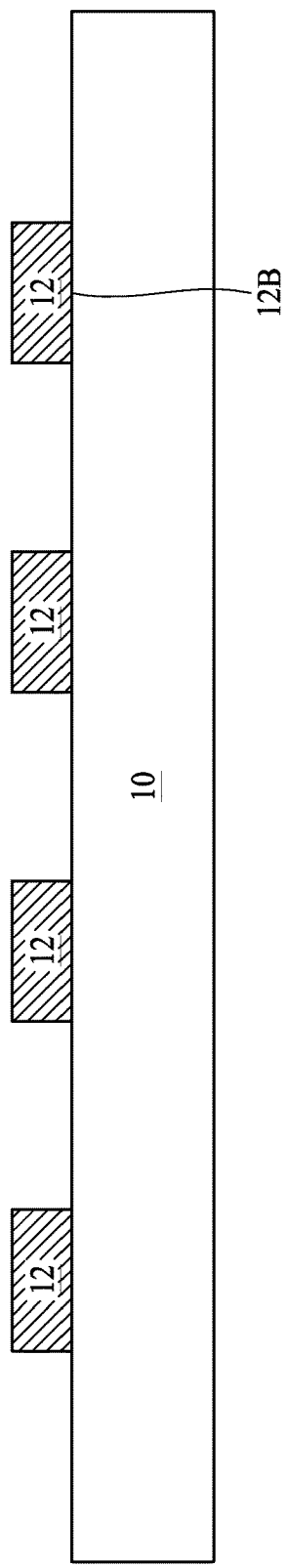
FIG. 2A, FIG. 2B, FIG. 2C, FIG. 2D, FIG. 2E, FIG. 2F, FIG. 2G and FIG. 2H illustrate an example of a manufacturing method of a semiconductor device package in accordance with some embodiments of the present disclosure.
Figure 2B:
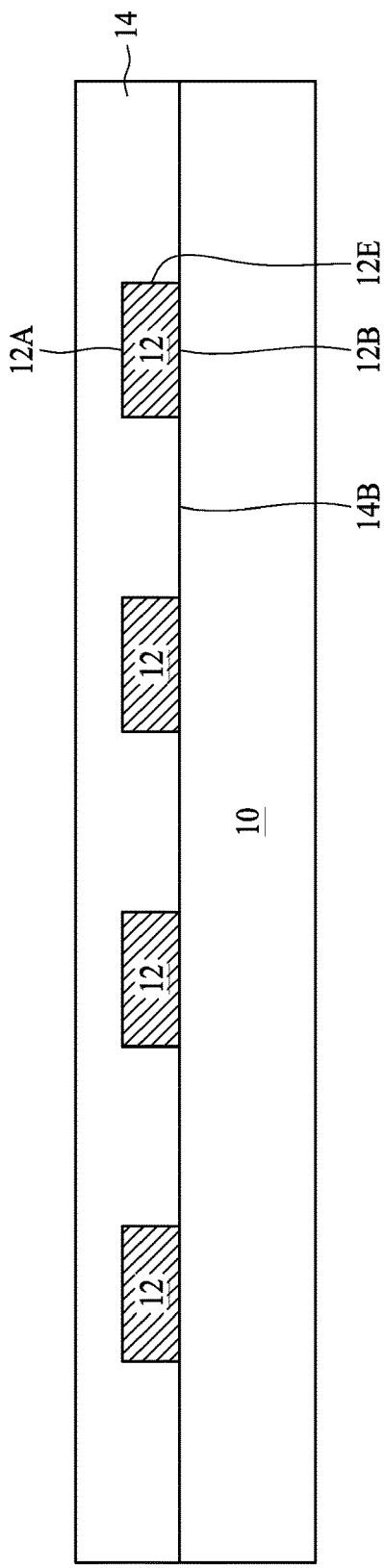

FIG. 2A, FIG. 2B, FIG. 2C, FIG. 2D, FIG. 2E, FIG. 2F, FIG. 2G and FIG. 2H illustrate an example of a manufacturing method of the semiconductor device package 1 in accordance with some embodiments of the present disclosure. As depicted in FIG. 2A, at least one electrical element 12 is formed or disposed over a carrier 10. The carrier 10 is configured as a temporary holder, and will be removed subsequently. In some embodiments, the carrier 10 is a wafer such as a semiconductor wafer. A lower surface 12B of the electrical element 12 faces the carrier 10. In some embodiments, the electrical element 12 is formed or disposed over the carrier 10 by electroplating, deposition or other suitable methods. As depicted in FIG. 2B, the first molding layer 14 is disposed over the carrier 10 to encapsulate the at least one electrical element 12. In some embodiments, the first molding layer 14 is disposed by molding, attaching or by other suitable methods. In some embodiments, the first molding layer 14 covers the edge 12E and the upper surface of the electrical element 12.

Figure 2C:
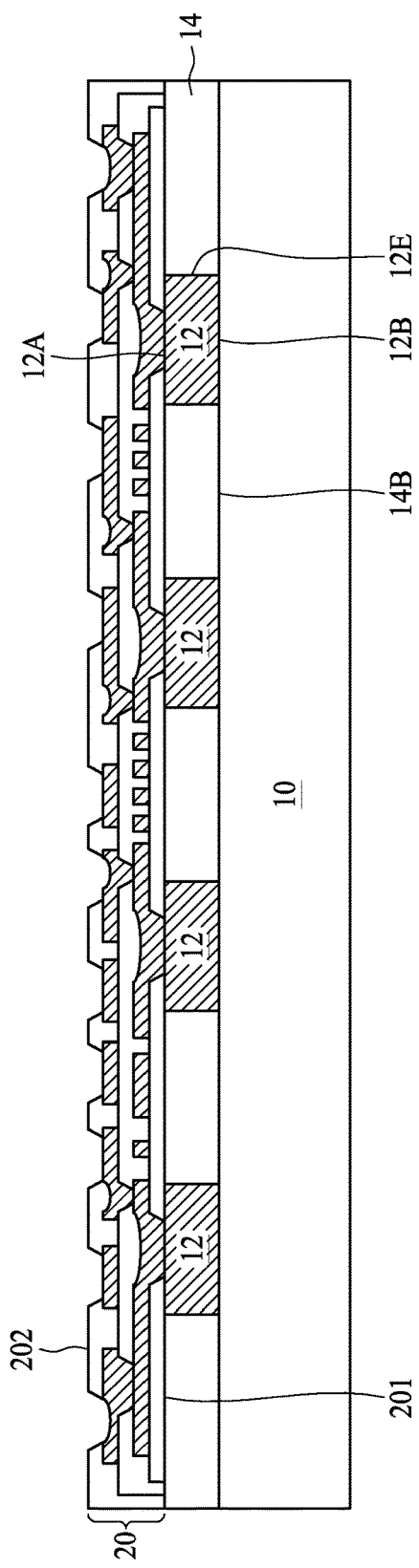
Figure 2D:
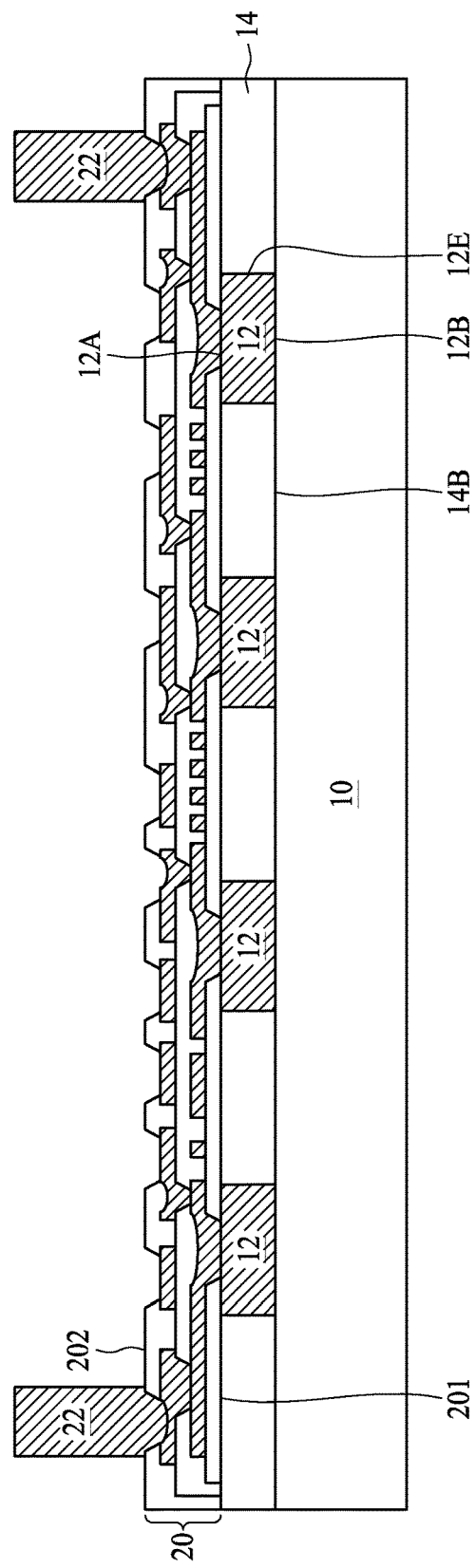

As depicted in FIG. 2C, a portion of the first molding layer 14 is removed, e.g., by grinding, to expose the upper surface 12A of the at least one electrical element 12 and then a first circuit layer 20 is formed or disposed over the first molding layer 14 and the upper surface 12A of the at least one electrical element 12. The first circuit layer 20 includes a first surface 201 facing and electrically connected to the electrical element 12, and a second surface 202 opposite to the first surface 201. In some embodiments, at least one interconnect 22 is formed or disposed over the second surface 202 of the first circuit layer 20 and electrically connected to the first circuit layer 20 as depicted in FIG. 2D. In some embodiments, the interconnect 22 is formed or disposed over the first circuit layer 20 by electroplating, deposition or by other suitable methods.

Figure 2E:
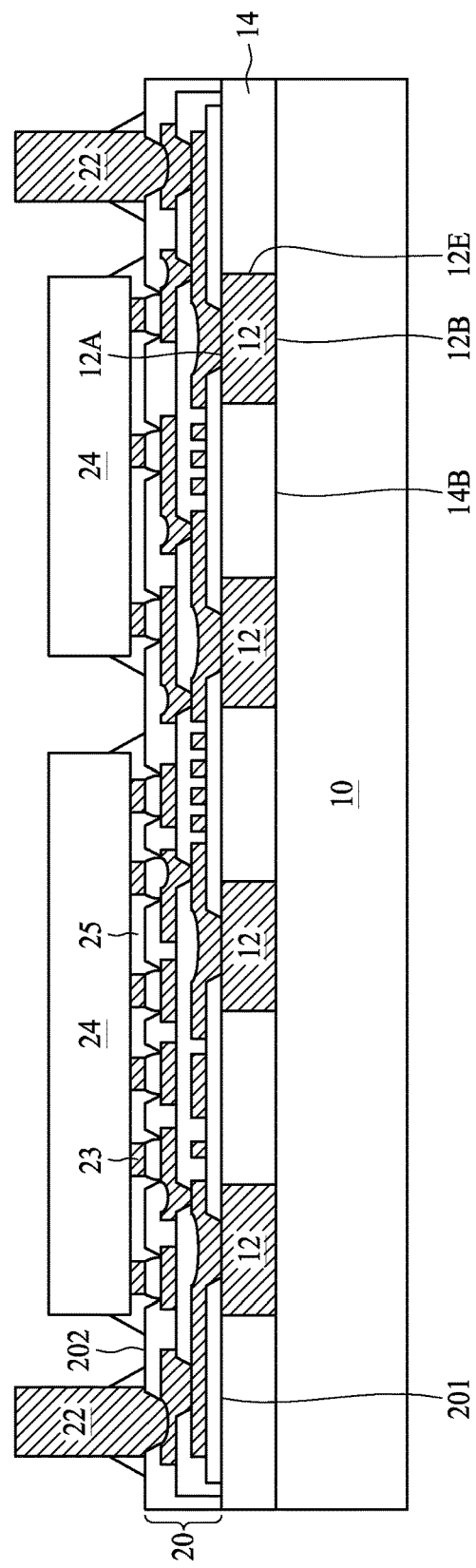

As depicted in FIG. 2E, one or more electronic components 24 are formed or disposed over and electrically connected to the first circuit layer 20. In some embodiments, the electronic component 24 is bonded on the second surface 202 of the first circuit layer 20 via conductive bumps 23. In some embodiments, the underfill layer 25 is filled between the electronic component 24 and the first circuit layer 20 to protect the conductive bumps 23.

Figure 2F:
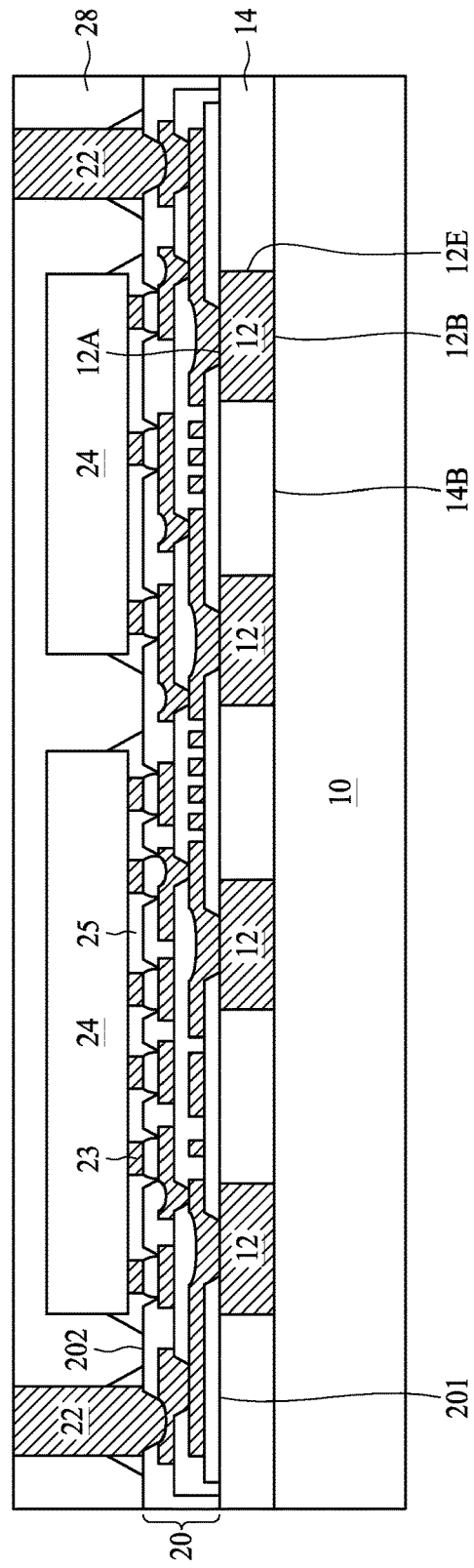

As depicted in FIG. 2F, the second molding layer 28 is disposed over the first circuit layer 20 to encapsulate the electronic component 24. In some embodiments, the second molding layer 28 is disposed by molding, attaching or by other suitable methods. In some embodiments, a portion of the second molding layer 28 is removed, e.g., by grinding, to expose the interconnect 22.

Figure 2G:
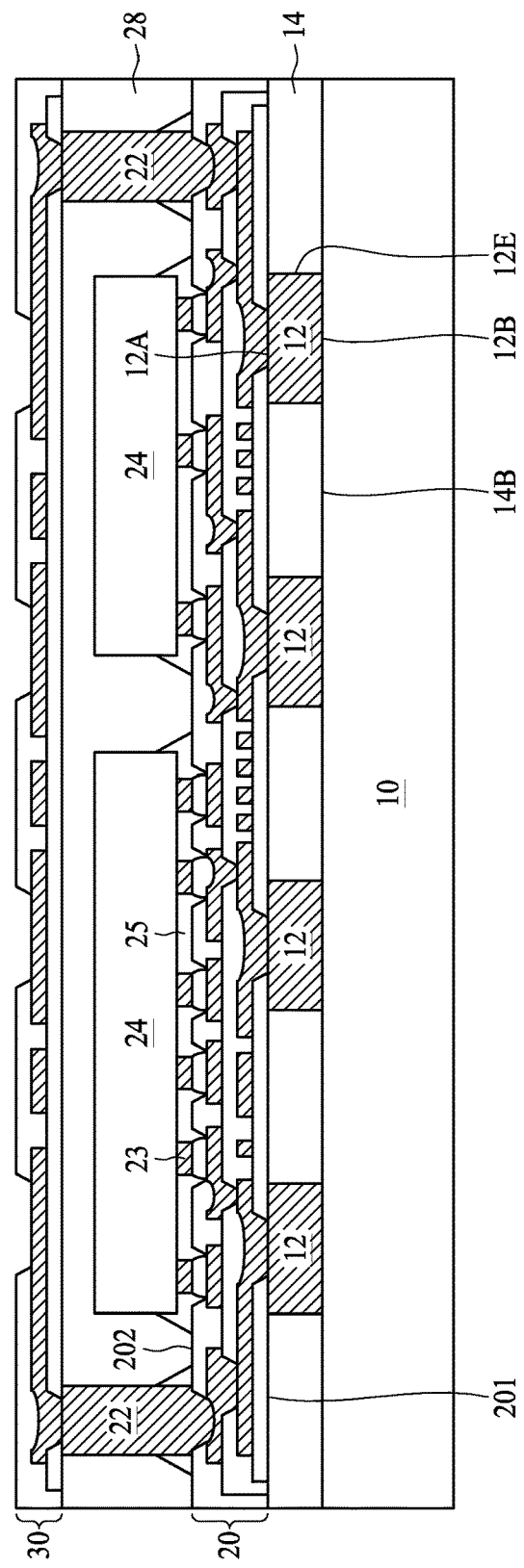
Figure 2H:
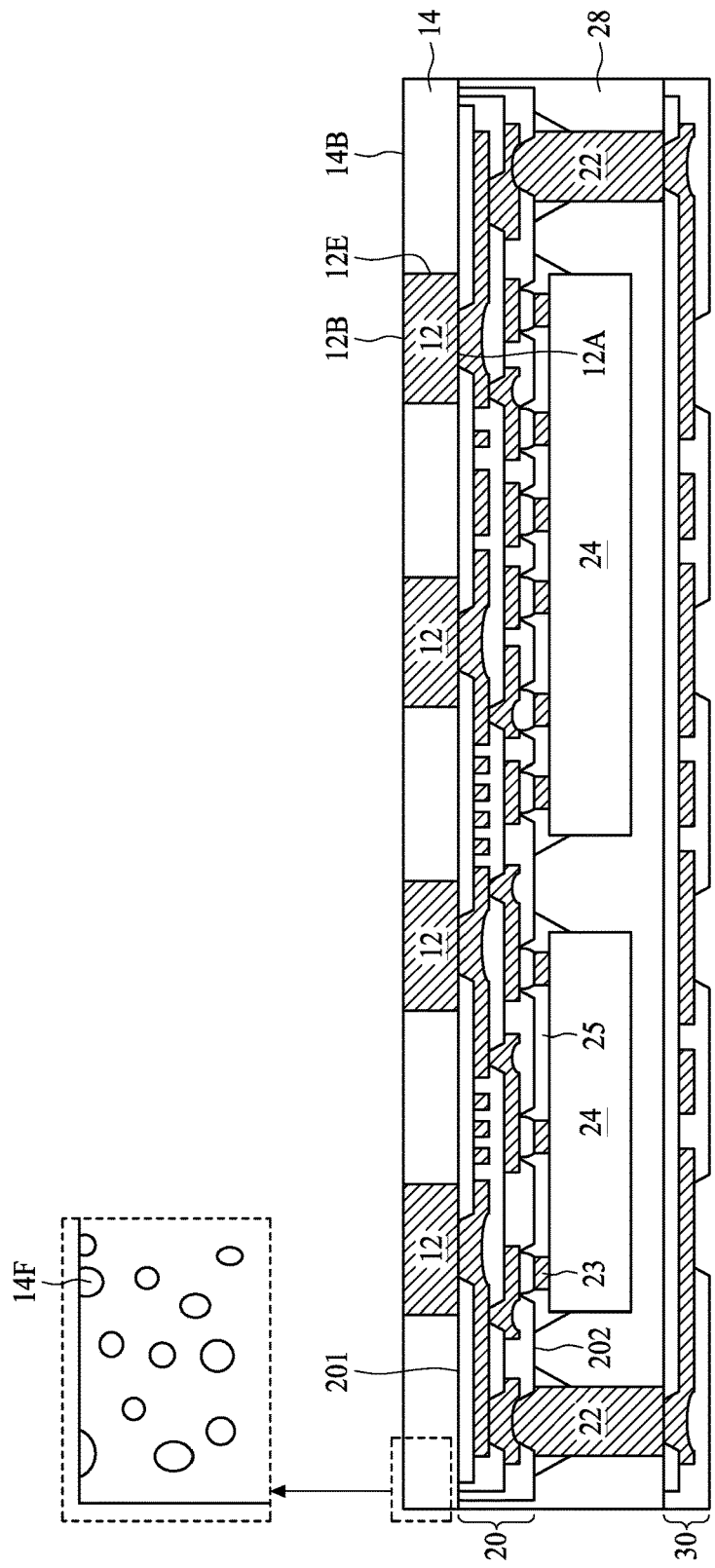

In some embodiments, the second circuit layer 30 is formed or disposed over the second molding layer 28 and the at least one interconnect 22 as depicted in FIG. 2G. In some embodiments, the second circuit layer 30 is electrically connected to the first circuit layer 20 through the interconnect 22. As depicted in FIG. 2H, the carrier 10 is removed from the first circuit layer 20. In some embodiments, a portion of the first molding layer 14 and a portion of the at least one electrical element 12 are removed, e.g., by grinding, to expose the lower surface 12B of the at least one electrical element 12. Accordingly, the lower surface 12B of the at least one electrical element 12 and the lower surface 14B of the first molding layer 14 are substantially coplanar, and at least one of the fillers 14F in the first molding layer 14 has a cutting plane adjacent to the lower surface 14B of the first molding layer 14.

In some embodiments, at least one electrical contact 32 is formed or disposed over the lower surface 12B of the at least one electrical element 12 to form the semiconductor device package 1 as illustrated in FIG. 1.

The semiconductor device package and manufacturing method of the present disclosure are not limited to the above-mentioned embodiments, and may include other different embodiments. To simplify the description and for the convenience of comparison between each of the embodiments of the present disclosure, the same components in each of the following embodiments are marked with the same numerals.

Figure 3:
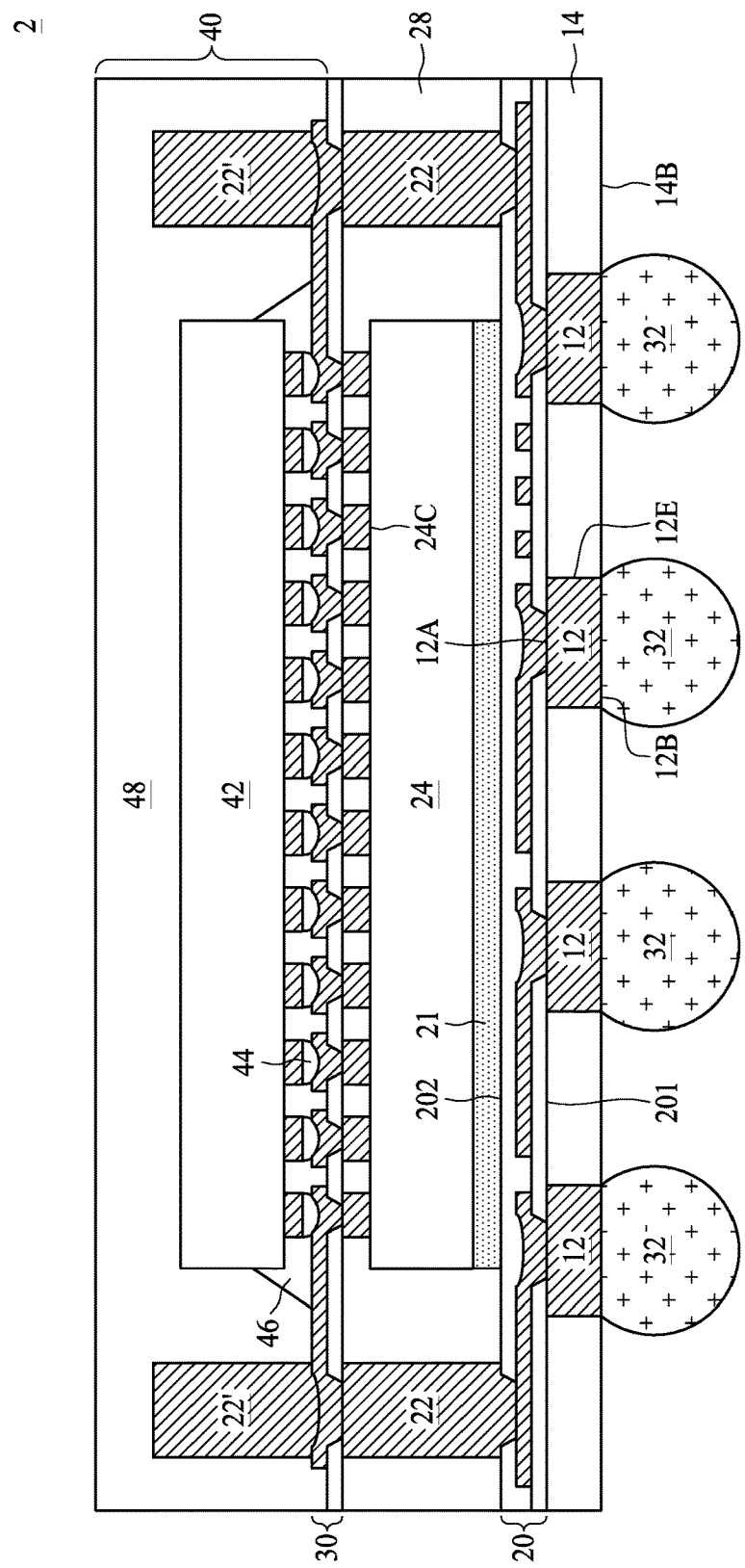
FIG. 3 is a cross-sectional view of a semiconductor device package in accordance with some embodiments of the present disclosure.

FIG. 3 is a cross-sectional view of a semiconductor device package 2 in accordance with some embodiments of the present disclosure. As shown in FIG. 3, different from the semiconductor device package 1, the electronic component 24 is bonded to the second surface 202 of the first circuit layer 20 with an adhesive layer 21 such as a die attach film (DAF). In some embodiments, the electronic component 24 includes conductors 24C such as conductive pillars or conductive pads on an upper surface of the electronic component 24 opposite to the surface adjacent to the adhesive layer 21 and is electrically connected to the second circuit layer 30. The electronic component 24 is electrically connected to the first circuit layer 20 through the second circuit layer 30 and the interconnect 22. In some embodiments, the semiconductor device package 2 further includes a package 40 stacked over and electrically connected to the second circuit layer 30. The package 40 may be any type of semiconductor device package or IC. In some embodiments, the package 40 includes at least one interconnect 22' and one or more electronic components 42 disposed over and electrically connected to the second circuit layer 30. In some embodiments, the electronic component 42 is bonded on the second circuit layer 30 with conductive bumps 44. In some embodiments, an underfill layer 46 is filled between the electronic component 42 and the second circuit layer 30 to protect the conductive bumps 44. In some embodiments, a third molding layer 48 is disposed over the second circuit layer 30 to encapsulate the electronic component 42. In some embodiments, the third molding layer 48 exposes the interconnect 22' to connect with another device.

In some embodiments, the first molding layer 14, the second molding layer 28 and the third molding layer 48 have different CTEs. The CTEs of the first molding layer 14, the second molding layer 28 and the third molding layer 48 are configured to be matched so as to alleviate warpage. In some embodiments, the CTE of the first molding layer 14 is greater than the CTE of the second molding layer 28, and the CTE of the second molding layer 28 is greater than the CTE of the third molding layer 48. The CTE difference among the first molding layer 14, the second molding layer 28 and the third molding layer 48 can be implemented by selecting different types or materials of the first molding layer 14, the second molding layer 28 and the third molding layer 48, by selecting different materials or sizes of the fillers of the first molding layer 14, the second molding layer 28 and the third molding layer 48, or by other suitable approaches. In some embodiments, the first molding layer 14, the second molding layer 28 and the third molding layer 48 are selected from different molding compounds such as a film molding compound, a liquid molding compound or a granular molding compound so as to have different CTEs. By way of example, in some embodiments, the first molding layer 14 is a film molding compound, the second molding layer 28 is a liquid molding compound, and the third molding layer 48 is a granular molding compound. In some embodiments, the fillers of the first molding layer 14, the second molding layer 28 and the third molding layer 48 are different in material. In some embodiments, the fillers of the first molding layer 14, the second molding layer 28 and the third molding layer 48 are different in size. By way of example, in some embodiments, the size of the filler of the first molding layer 14 is larger than the size of the filler of the second molding layer 28, and the size of the filler of the second molding layer 28 is larger than the size of the filler of the third molding layer 48.

Figure 4A:
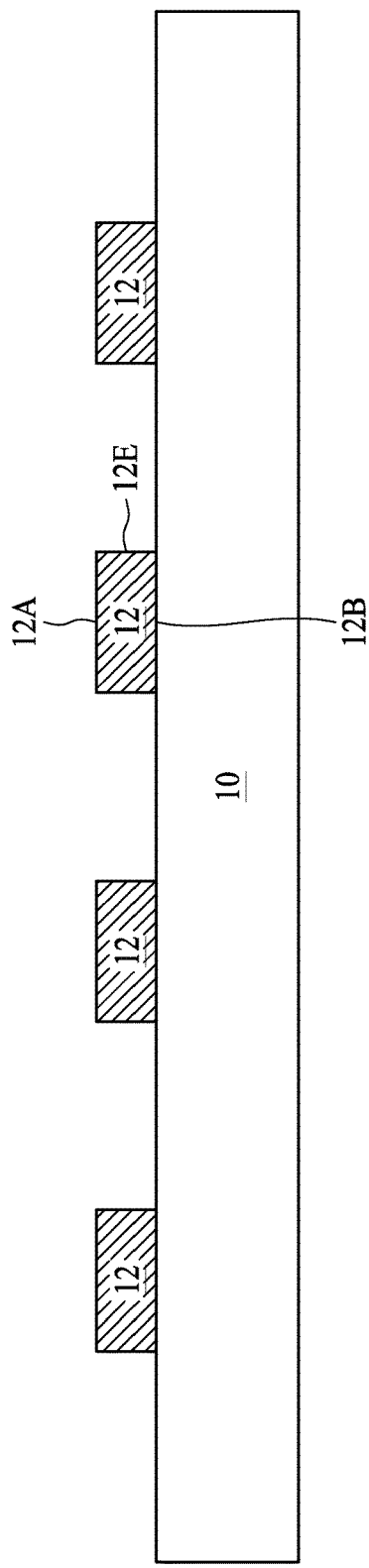
FIG. 4A, FIG. 4B, FIG. 4C, FIG. 4D, FIG. 4E and FIG. 4F illustrate an example of a manufacturing method of a semiconductor device package in accordance with some embodiments of the present disclosure.
Figure 4B:
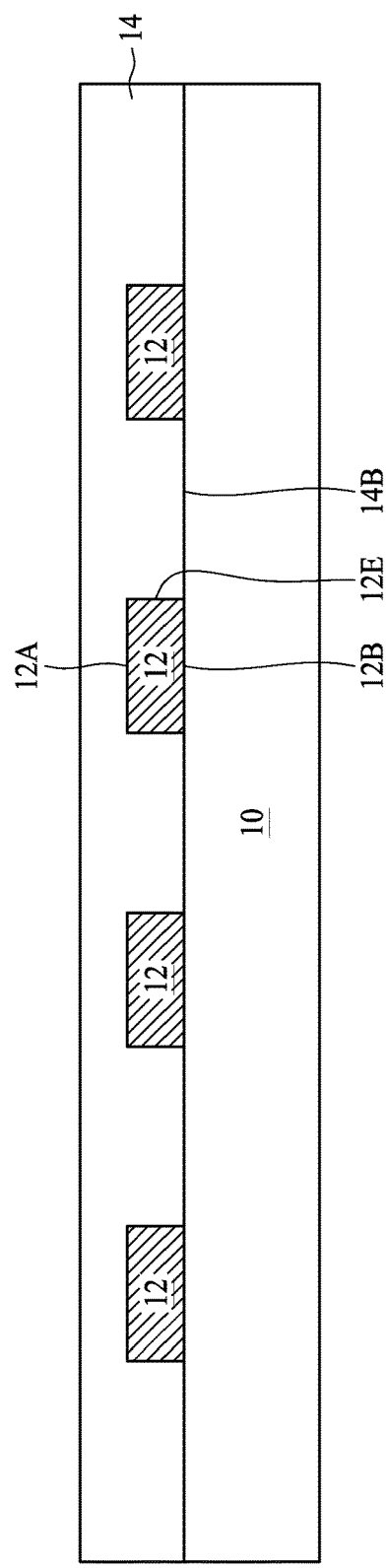

FIG. 4A, FIG. 4B, FIG. 4C, FIG. 4D, FIG. 4E and FIG. 4F illustrate an example of a manufacturing method of the semiconductor device package 2 in accordance with some embodiments of the present disclosure. As depicted in FIG. 4A, at least one electrical element 12 is formed or disposed over a carrier 10. The lower surface 12B of the electrical element 12 faces the carrier 10. In some embodiments, the electrical element 12 is formed or disposed over the carrier 10 by electroplating, deposition or by other suitable methods. As depicted in FIG. 4B, a first molding layer 14 is disposed over the carrier 10 to encapsulate the at least one electrical element 12. In some embodiments, the first molding layer 14 is disposed by molding, attaching or by other suitable methods. In some embodiments, the first molding layer 14 covers the edge 12E and the upper surface of the electrical element 12.

Figure 4C:
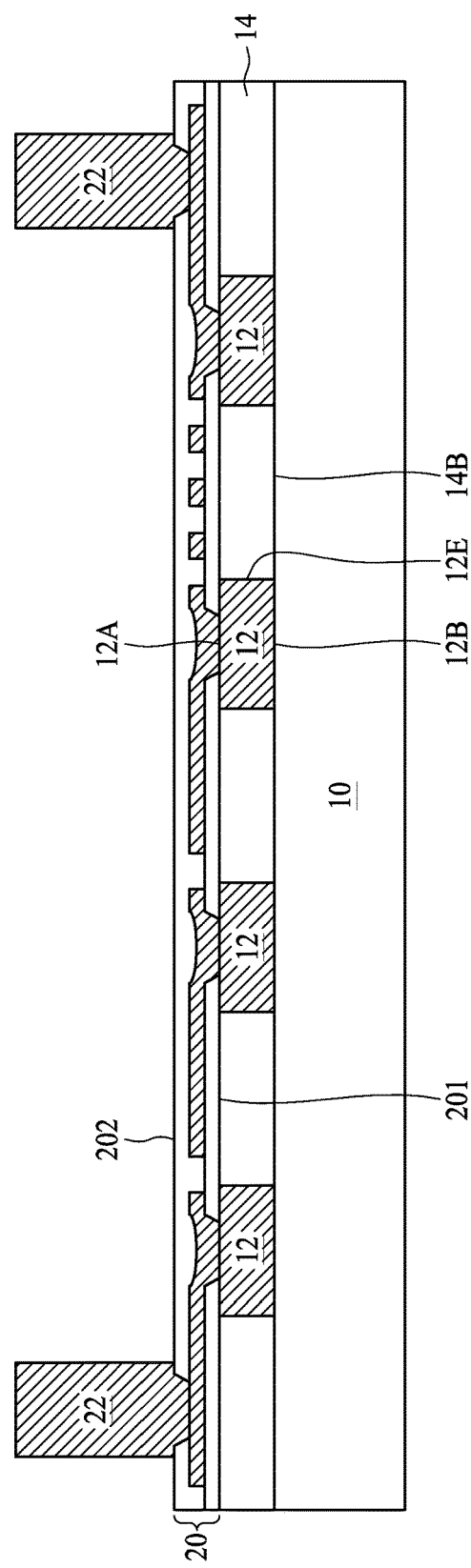

As depicted in FIG. 4C, a portion of the first molding layer 14 is removed, e.g., by grinding, to expose the upper surface 12A of the at least one electrical element 12 and then the first circuit layer 20 is formed or disposed over the first molding layer 14 and the at least one electrical element 12. In some embodiments, at least one interconnect 22 is formed or disposed over the second surface 202 of the first circuit layer 20 and electrically connected to the first circuit layer 20. In some embodiments, the interconnect 22 is formed or disposed over the first circuit layer 20 by electroplating, deposition or by other suitable methods.

Figure 4D:
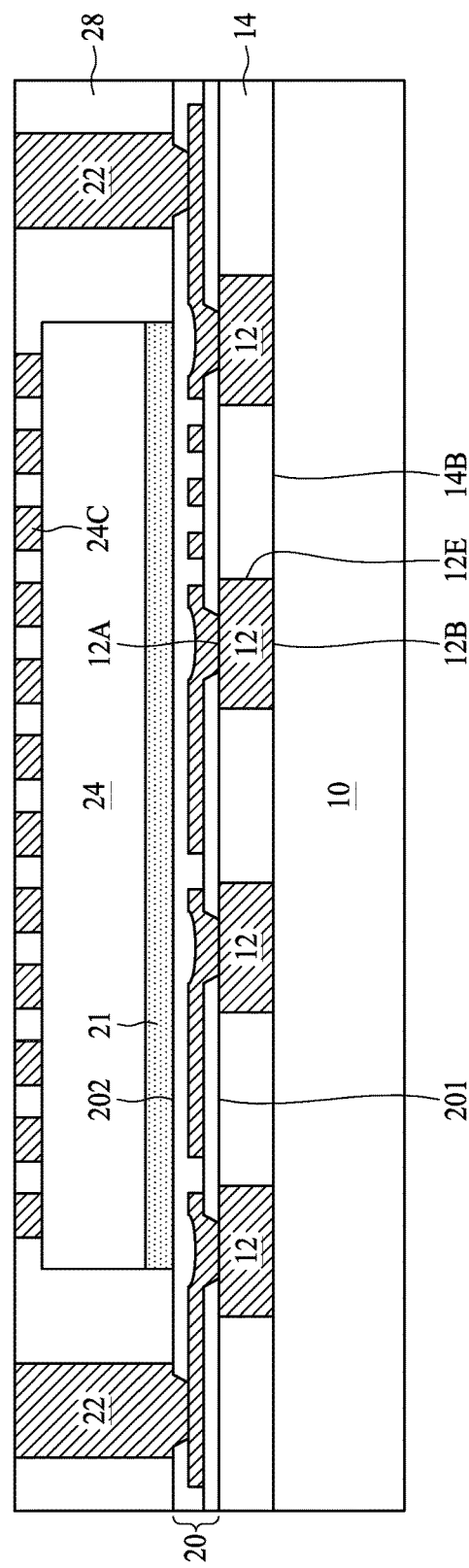

As depicted in FIG. 4D, one or more electronic components 24 are formed or disposed over the first circuit layer 20. In some embodiments, the electronic component 24 is bonded to the second surface 202 of the first circuit layer 20 via the adhesive layer 21 such as a DAF. The electronic component 24 includes conductors 24C such as conductive pillars or conductive pads on an upper surface of the electronic component 24 opposite to surface adjacent to the adhesive layer 21. Subsequently, a second molding layer 28 is disposed over the first circuit layer 20 to encapsulate the electronic component 24 and the interconnect 22. In some embodiments, the second molding layer 28 is disposed by molding, attaching or by other suitable methods. In some embodiments, a portion of the second molding layer 28 is removed, e.g., by grinding, to expose the interconnect 22 and the conductors 24C.

Figure 4E:
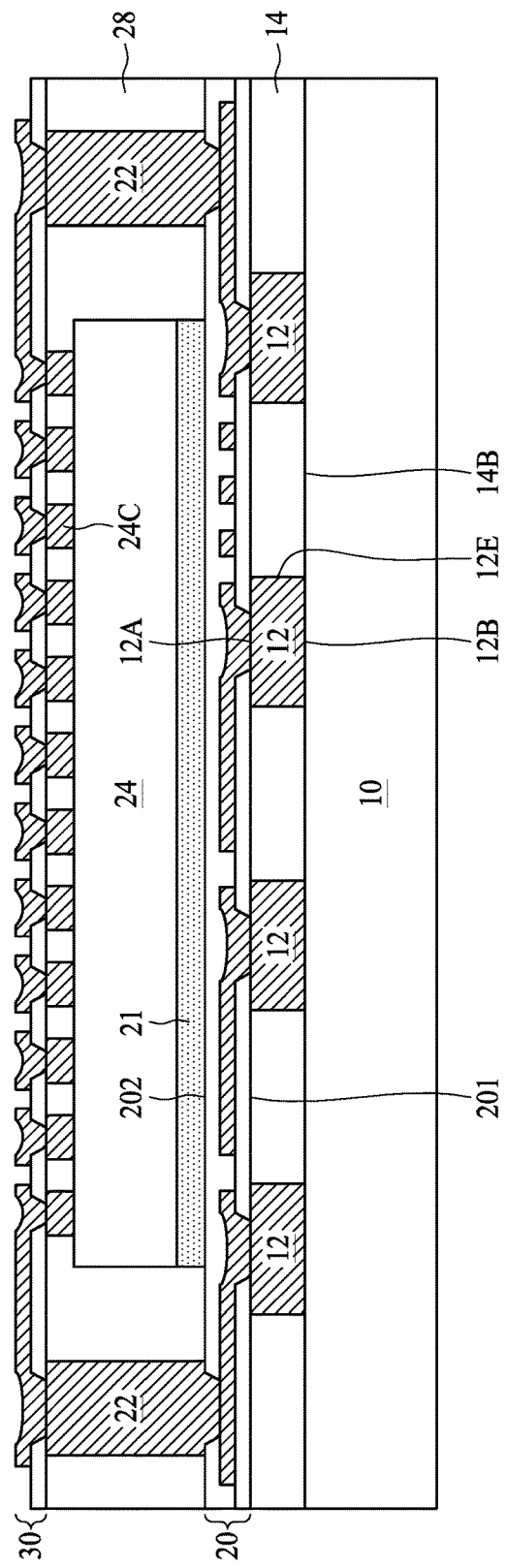

In some embodiments, the second circuit layer 30 is formed or disposed over the second molding layer 28 and the at least one interconnect 22 as depicted in FIG. 4E. In some embodiments, the second circuit layer 30 is electrically connected to the first circuit layer 20 through the interconnect 22. In some embodiments, the second circuit layer 30 is electrically connected to the electronic component 24 through the conductors 24C.

Figure 4F:
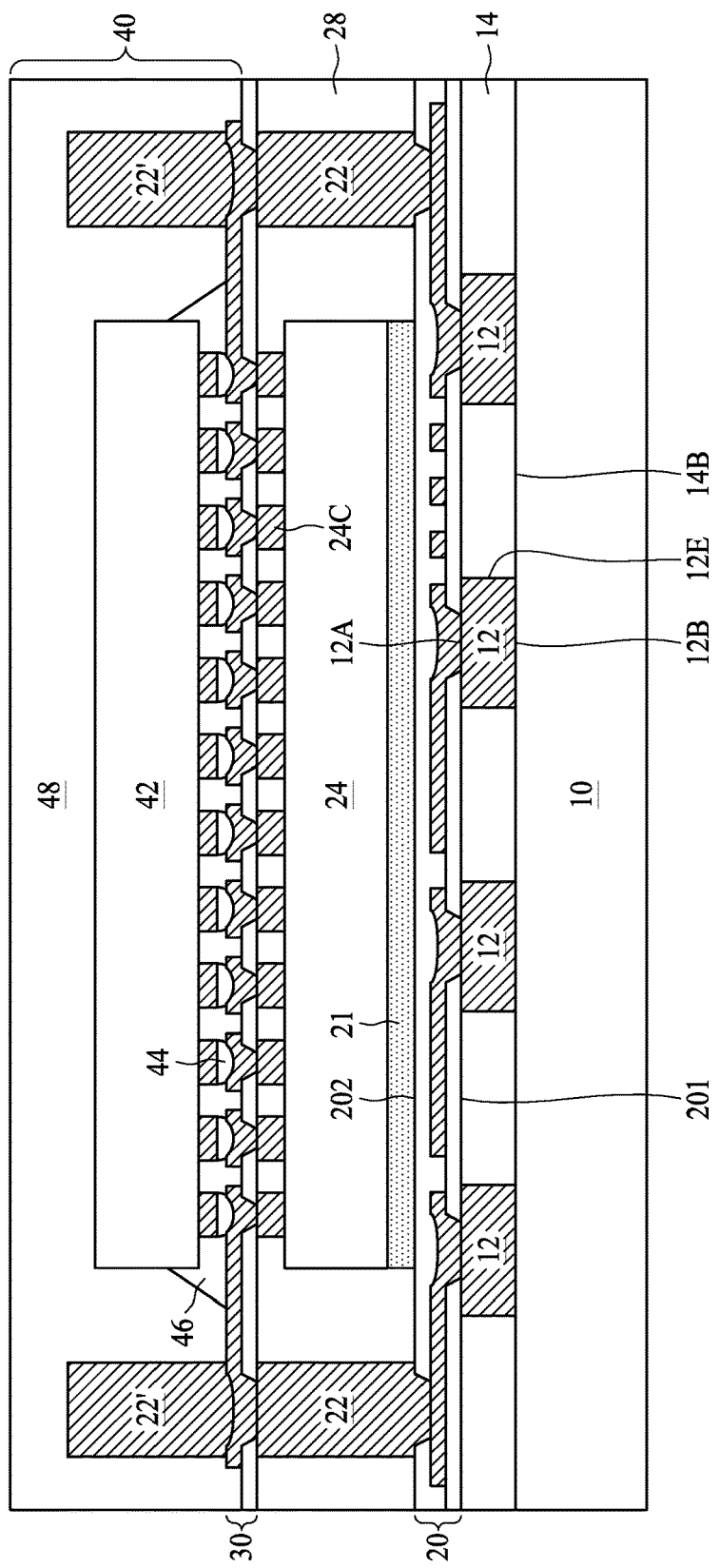

As depicted in FIG. 4F, at least one interconnect 22' is disposed over and electrically connected to the second circuit layer 30 and then one or more electronic components 42 are formed or disposed over and electrically connected to the second circuit layer 30. In some embodiments, the electronic component 42 is bonded on the second circuit layer 30 with the conductive bumps 44. In some embodiments, an underfill layer 46 is filled between the electronic component 42 and the second circuit layer 30 to protect the conductive bumps 44. A third molding layer 48 is disposed over the second circuit layer 30 to encapsulate the electronic component 42. In some embodiments, the third molding layer 48 is disposed by molding, attaching or by other suitable methods. In some embodiments, a portion of the third molding layer 48 is removed, e.g., by grinding, to expose the interconnect 22' to connect with another device.

In some embodiments, the at least one interconnect 22', the electronic component 42, the conductive bumps 44, the underfill layer 46 and the third molding layer 48 may be a pre-formed package 40 to dispose over and electrically connect to the second circuit layer 30. The carrier 10 is removed from the first circuit layer 20. In some embodiments, a portion of the first molding layer 14 and a portion of the at least one electrical element 12 are removed, e.g., by grinding, to expose the lower surface 12B of the at least one electrical element 12. Accordingly, the lower surface 12B of the at least one electrical element 12 and the lower surface 14B of the first molding layer 14 are substantially coplanar, and at least one of the fillers in the first molding layer 14 has a cutting plane adjacent to the lower surface 14B of the first molding layer 14. In some embodiments, at least one electrical contact 32 is formed or disposed over the lower surface 12B of the at least one electrical element 12 to form the semiconductor device package 2 as illustrated in FIG. 3.

Figure 5:
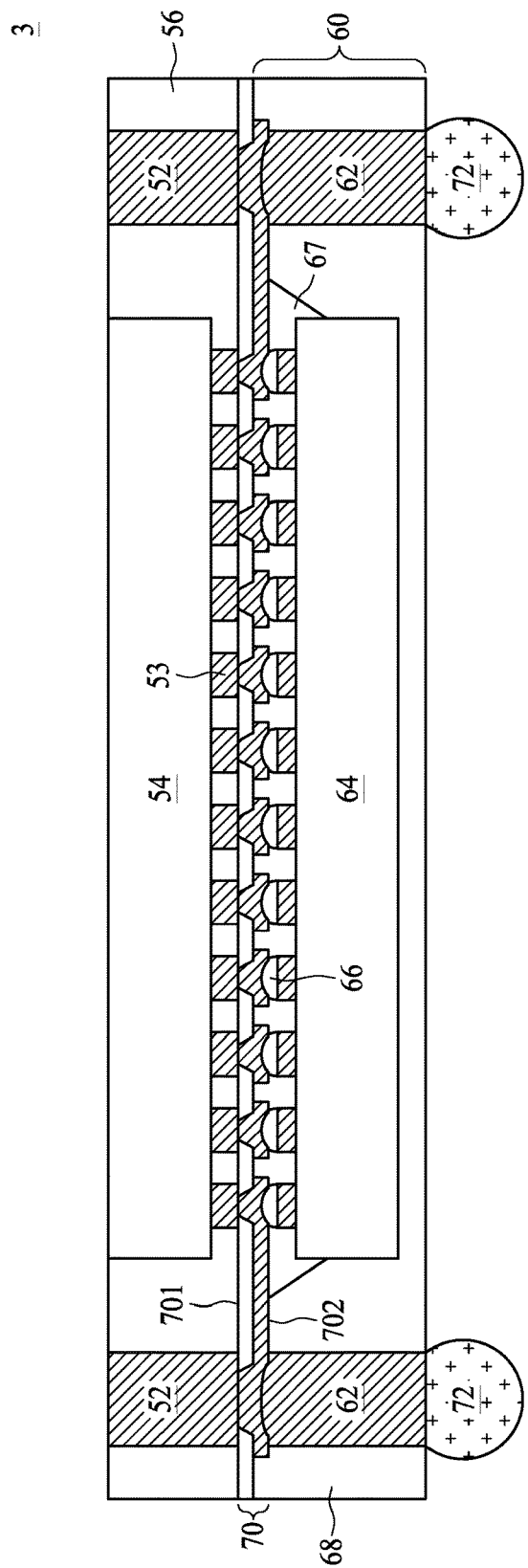
FIG. 5 is a cross-sectional view of a semiconductor device package in accordance with some embodiments of the present disclosure.

FIG. 5 is a cross-sectional view of a semiconductor device package 3 in accordance with some embodiments of the present disclosure. As shown in FIG. 5, the semiconductor device package 3 includes a circuit layer 70, an electronic component 54, at least one interconnect 52 and a first molding layer 56. The circuit layer 70 includes a first surface 701 and a second surface 702 opposite to the first surface 701. In some embodiments, the circuit layer 70 includes an RDL. The electronic component 54 is disposed over the first surface 701 and is electrically connected to the circuit layer 70. In some embodiments, the electronic component 54 is a flip chip component mounted on the first surface 701 of the circuit layer 70 by SMT. By way of example, in some embodiments, the electronic component 54 is bonded to the first surface 701 via conductive bumps 53 such as solder bumps, solder balls, solder pastes or the like. The interconnect 52 is disposed over the first surface 701 and is electrically connected to the circuit layer 70. The first molding layer 56 is disposed over the first surface 701 of the circuit layer 70. In some embodiments, the first molding layer 56 encapsulates the interconnect 52 and the electronic component 54.

In some embodiments, the semiconductor device package 3 further includes a package 60 disposed over the second surface 702 of the circuit layer 70 and electrically connected to the circuit layer 70. The package 60 may be any type of semiconductor device package or IC. In some embodiments, the package 60 includes at least one interconnect 62 and one or more electronic components 64 disposed over and electrically connected to the circuit layer 70. In some embodiments, the electronic component 64 is bonded to the circuit layer 70 via conductive bumps 66. In some embodiments, an underfill layer 67 is filled between the electronic component 64 and the circuit layer 70 to protect the conductive bumps 66. In some embodiments, a second molding layer 68 is disposed over the circuit layer 70 to encapsulate the electronic component 64. In some embodiments, the second molding layer 68 exposes the interconnect 62 to connect with another device. In some embodiments, the semiconductor device package 3 further includes at least one electrical contact 72 disposed over the package 60 and electrically connected to the circuit layer 70 through the interconnect 62 of the package 60. In some embodiments, the electrical contact 72 includes a conductive bump such as a solder bump, solder ball, a solder paste or the like, configured to be electrically connected to another electronic device such as a circuit board or the like.

In some embodiments, the first molding layer 56 and the second molding layer 68 have different CTEs. The CTEs of the first molding layer 56 and the second molding layer 68 are configured to be matched so as to alleviate warpage. In some embodiments, the CTE of the second molding layer 68 is greater than the CTE of the first molding layer 56. The CTE difference between the first molding layer 56 and the second molding layer 68 can be implemented by selecting different types or materials of the first molding layer 56 and the second molding layer 68, by selecting different materials or sizes of the fillers of the first molding layer 56 and the second molding layer 68, or by other suitable approaches. In some embodiments, the first molding layer 56 and the second molding layer 68 are selected from different molding compounds such as a film molding compound, a liquid molding compound or a granular molding compound so as to have different CTEs. By way of example, in some embodiments, the first molding layer 56 is a granular molding compound or a liquid molding compound, and the second molding layer 68 is a liquid molding compound or a film molding compound. In some embodiments, the first molding layer 56 and the second molding layer 68 include different molding materials. In some embodiments, the fillers of the first molding layer 56 and the second molding layer 68 are different in material. In some embodiments, the fillers of the first molding layer 56 and the second molding layer 68 are different in size. By way of example, in some embodiments, the size of the filler of the second molding layer 68 is larger than the size of the filler of the first molding layer 56.

Figure 6A:
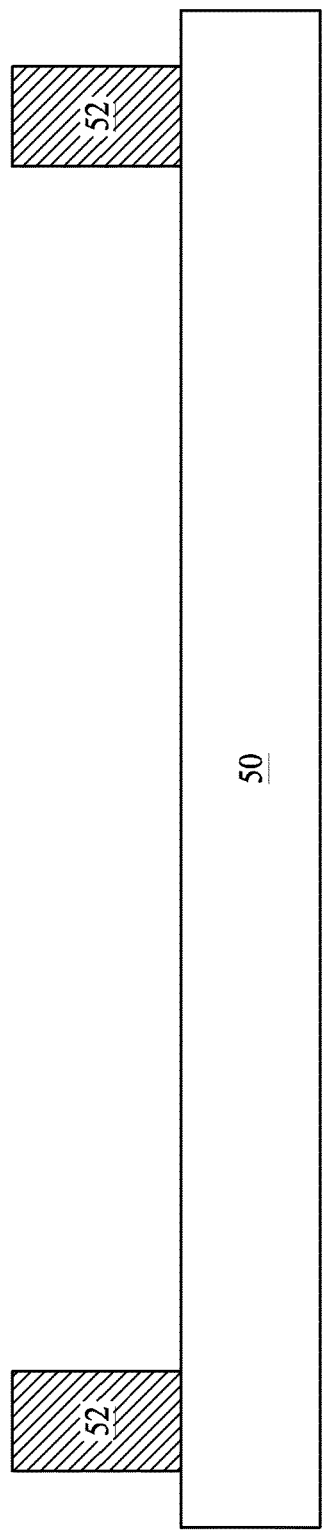
FIG. 6A, FIG. 6B, FIG. 6C and FIG. 6D illustrate an example of a manufacturing method of a semiconductor device package in accordance with some embodiments of the present disclosure.
Figure 6B:
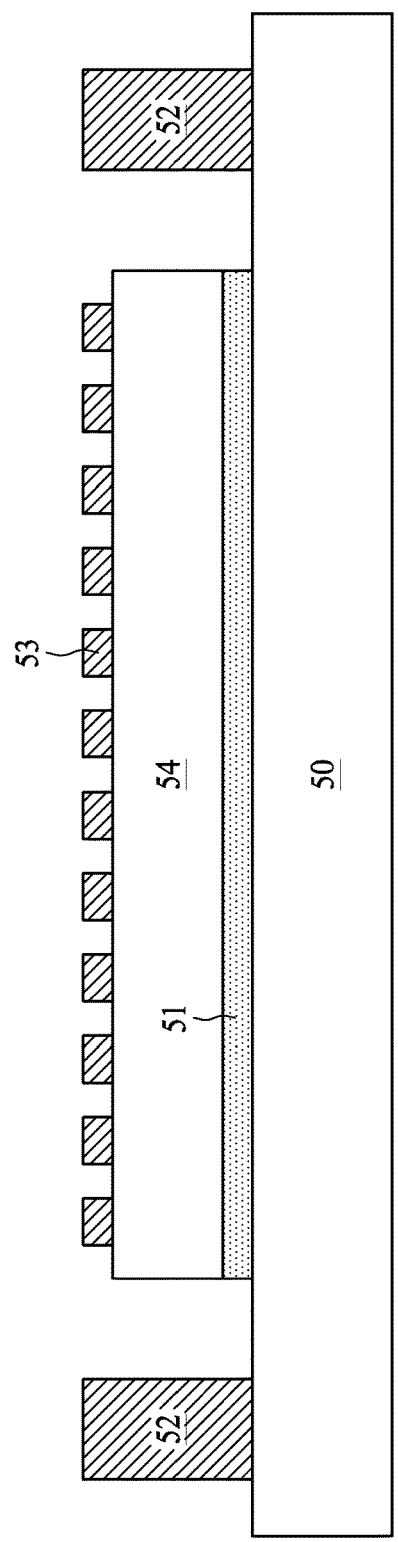

FIG. 6A, FIG. 6B, FIG. 6C and FIG. 6D illustrate an example of a manufacturing method of the semiconductor device package 3 in accordance with some embodiments of the present disclosure. As depicted in FIG. 6A, at least one interconnect 52 is formed or disposed over a carrier 50. As depicted in FIG. 6B, the electronic component 54 is formed or disposed over the carrier 50. In some embodiments, the electronic component 54 is bonded to the carrier 50 via an adhesive layer 51. In some embodiments, the electronic component 54 includes conductive bumps 53 on a surface of the electronic component 54 opposite the surface adjacent to the adhesive layer 51.

Figure 6C:
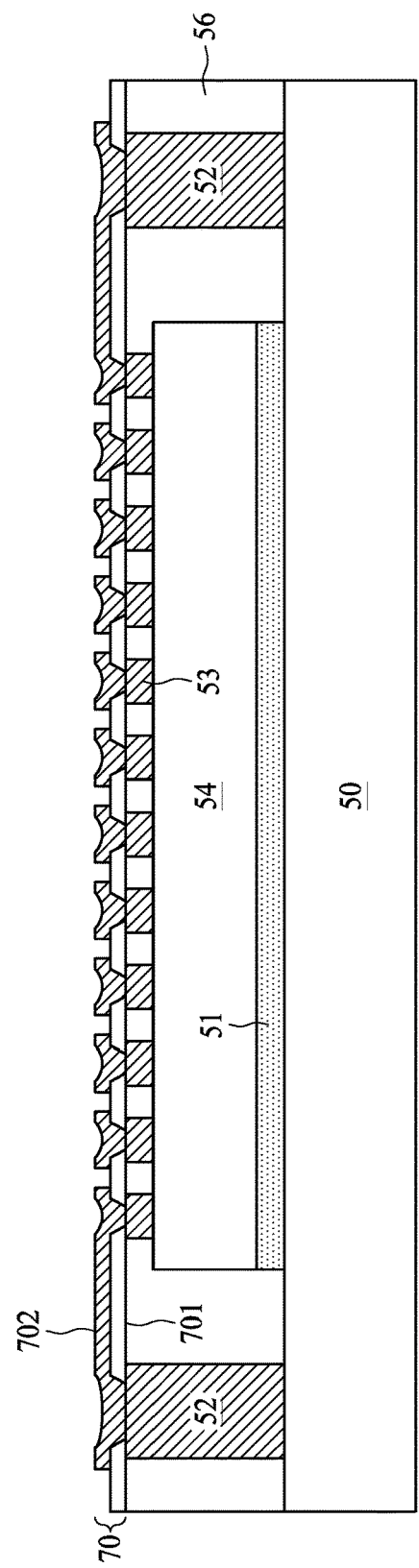

As depicted in FIG. 6C, the first molding layer 56 is formed or disposed over the carrier 50 to encapsulate the electronic component 54 and the interconnect 52. In some embodiments, a portion of the first molding layer 56 is removed, e.g., by grinding, to expose the interconnect 52 and the conductive bumps 53. The circuit layer 70 is then formed or disposed over the first molding layer 56 and electrically connected to the interconnect 52 and the electronic component 54 through the conductive bumps 53.

Figure 6D:
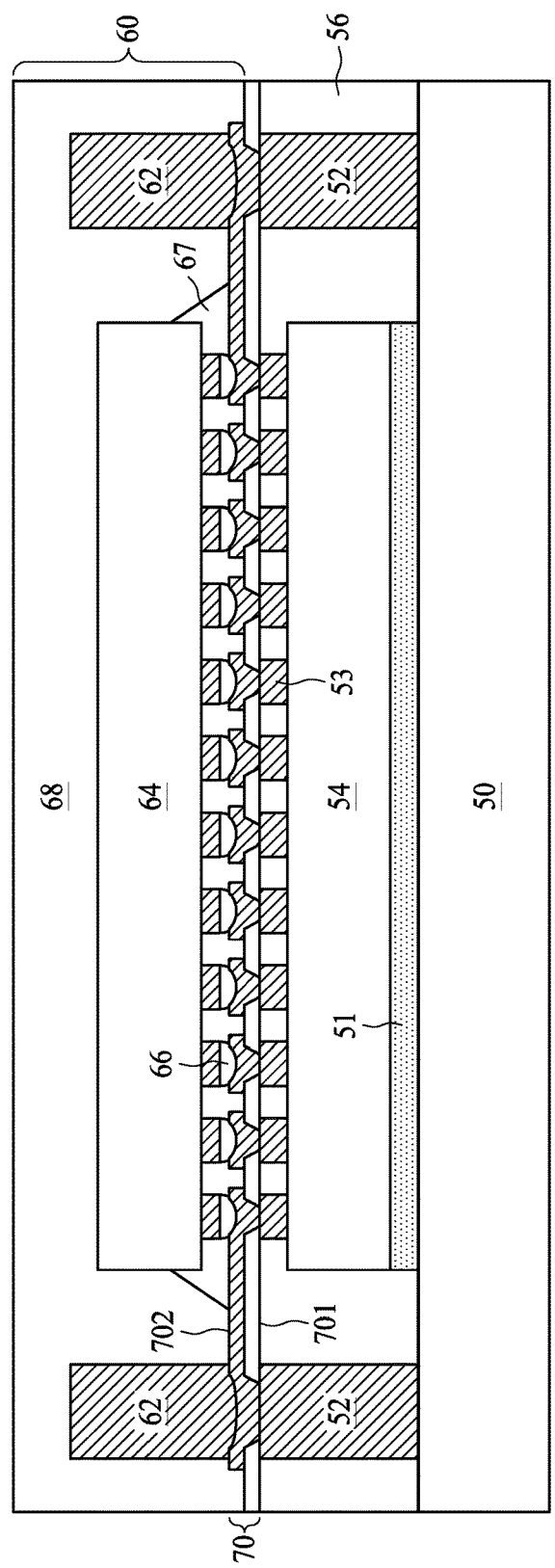

As depicted in FIG. 6D, at least one interconnect 62 is disposed over and electrically connected to the circuit layer 70 and then one or more electronic components 64 are formed or disposed over and electrically connected to the circuit layer 70. In some embodiments, the electronic component 64 is bonded to the circuit layer 70 via the conductive bumps 66. In some embodiments, the underfill layer 67 may be filled between the electronic component 64 and the circuit layer 70 to protect the conductive bumps 66. The second molding layer 68 is disposed over the circuit layer 70 to encapsulate the electronic component 64. In some embodiments, the second molding layer 68 is disposed by molding, attaching or by other suitable methods. In some embodiments, the carrier 50, the adhesive layer 51 and a portion of the second molding layer 68 are removed, e.g., by grinding, to expose the interconnect 62 to connect to the electrical contact 72 to form the semiconductor device package 3 as illustrated in FIG. 5.

In some embodiments, the at least one interconnect 62, the electronic component 64, the conductive bumps 66, the underfill layer 67 and the molding layer 68 may be a pre-formed package 60 to dispose over and electrically connect to the circuit layer 70.

A semiconductor device package of various embodiments of the present disclosure is compatible with wafer level package (WLP). The semiconductor device package is compatible with a package on package structure, hybrid package structure and 2.5 D/3 D package. The molding layer has a planar surface which allows a RDL with fine line width and pitch to be built up, and use of temporary bonding equipment can be reduced. The reduced height of the molding layer and interconnect shortens signal routes between different electronic components or packages, which improves capability and performance, and reduces power consumption of the semiconductor device package. The warpage can be controlled by adjusting materials, ingredients or types among the different molding layers. The electronic component can be a double side exposed component, which increases applications of the semiconductor device package.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 micrometers (μm), no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a first circuit layer including a first surface and a second surface opposite to the first surface;
   at least one electrical element disposed over the first surface of the first circuit layer and electrically connected to the first circuit layer;
   a first molding layer disposed over the first surface of the first circuit layer, wherein the first molding layer encapsulates an edge of the at least one electrical element, and a lower surface of the first molding layer and a lower surface of the at least one electrical element are substantially coplanar;
   an electronic component disposed over the second surface of the first circuit layer and electrically connected to the first circuit layer; and
   a second molding layer disposed over the second surface of the first circuit layer and encapsulating the electronic component, wherein the first molding layer and the second molding layer include different molding materials.

2. The semiconductor device package of claim 1, further comprising:
   a second circuit layer disposed over the second molding layer; and
   at least one interconnect disposed between the first circuit layer and the second circuit layer, encapsulated by the second molding layer, and electrically connected to the first circuit layer and the second circuit layer.

3. The semiconductor device package of claim 1, further comprising at least one electrical contact disposed over the electrical element, and electrically connected to the electrical element.

4. The semiconductor device package of claim 1, wherein:
   the first molding layer and the second molding layer each comprises a plurality of fillers, and the fillers of the first molding layer and the fillers of the second molding layer are different in size.

5. A semiconductor device package, comprising:
   a first circuit layer including a first surface and a second surface opposite to the first surface;
   at least one electrical element disposed over the first surface of the first circuit layer and electrically connected to the first circuit layer;
   a first molding layer disposed over the first surface of the first circuit layer and encapsulating the at least one electrical element;
   an electronic component disposed over the second surface of the first circuit layer and electrically connected to the first circuit layer; and
   a second molding layer disposed over the second surface of the first circuit layer and encapsulating the electronic component,
   wherein the first molding layer comprises a lower surface opposite to the first surface of the first circuit layer, the first molding layer comprises a plurality of fillers, and at least one of the fillers in the first molding layer has a cutting plane adjacent to the lower surface of the first molding layer.

6. The semiconductor device package of claim 5, wherein the first molding layer and the second molding layer are selected from a film molding compound, a liquid molding compound or a granular molding compound.

7. The semiconductor device package of claim 6, wherein the first molding layer includes the film molding compound, and the second molding layer includes the liquid molding compound or the granular molding compound.

8. The semiconductor device package of claim 5, wherein the first molding layer and the second molding layer include different molding materials.

9. The semiconductor device package of claim 8, wherein the first molding layer includes an Ajinomoto build-up film (ABF), and a material of the second molding layer includes biphenyl.

10. The semiconductor device package of claim 5, wherein the second molding layer includes a plurality of fillers, and the fillers of the first molding layer and the fillers of the second molding layer are different in material.

11. The semiconductor device package of claim 10, wherein the fillers of the first molding layer include aluminum oxide fillers, and the fillers of the second molding layer include silicon oxide fillers.

12. The semiconductor device package of claim 5, wherein the second molding layer includes a plurality of fillers, and the fillers of the first molding layer and the fillers of the second molding layer are different in size.

13. The semiconductor device package of claim 12, wherein a size of the fillers of the first molding layer is larger than a size of the fillers of the second molding layer.

14. The semiconductor device package of claim 5, wherein the lower surface of the first molding layer and a lower surface of the at least one electrical element are substantially coplanar.

15. The semiconductor device package of claim 5, further comprising:
a second circuit layer disposed over the second molding layer; and
at least one interconnect disposed between the first circuit layer and the second circuit layer, encapsulated by the second molding layer, and electrically connected to the first circuit layer and the second circuit layer.

16. The semiconductor device package of claim 5, wherein:
a coefficient of thermal expansion (CTE) of the first molding layer is different from the CTE of the second molding layer.

17. A method of manufacturing a semiconductor device package, comprising:
disposing at least one electrical element over a carrier;
disposing a first molding layer over the carrier to encapsulate the at least one electrical element;
disposing a first circuit layer over the first molding layer and the at least one electrical element;
disposing an electronic component over the first circuit layer; and
disposing a second molding layer over the first circuit layer to encapsulate the electronic component.

18. The method of claim 17, further comprising:
removing the carrier; and
disposing at least one electrical contact over a lower surface of the at least one electrical element.

19. The method of claim 18, further comprising removing a portion of the first molding layer and a portion of the at least one electrical element to expose the lower surface of the at least one electrical element, wherein the lower surface of the at least one electrical element and a lower surface of the first molding layer are substantially coplanar.

20. The method of claim 17, further comprising:
disposing at least one interconnect over the first circuit layer prior to disposing the second molding layer; and
disposing a second circuit layer over the second molding layer and the at least one interconnect.

\* \* \* \* \*